US008673462B2

(12) United States Patent
Boday et al.

(10) Patent No.: US 8,673,462 B2
(45) Date of Patent: Mar. 18, 2014

(54) LOW VISCOSITY ELECTROSTATIC DISCHARGE (ESD) DISSIPATING ADHESIVE SUBSTANTIALLY FREE OF AGGLOMERATES

(75) Inventors: Dylan J. Boday, Tucson, AZ (US); Myron H. Gentrup, San Jose, CA (US); Icko E. T. Iben, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 13/225,320

(22) Filed: Sep. 2, 2011

(65) Prior Publication Data

US 2013/0057999 A1 Mar. 7, 2013

(51) Int. Cl.
*H01L 23/28* (2006.01)
*H05K 1/02* (2006.01)
*G11B 5/33* (2006.01)

(52) U.S. Cl.
USPC ..... 428/814; 428/323; 428/355 R; 360/234.7; 360/235.4; 360/235.7; 360/323; 252/518.1; 252/500; 252/502; 252/506; 252/511

(58) Field of Classification Search
None
See application file for complete search history.

(56) References Cited

U.S. PATENT DOCUMENTS

| | | | |
|---|---|---|---|
| 5,010,429 A | 4/1991 | Taguchi et al. | |
| 5,376,446 A | 12/1994 | Huang | |
| 5,413,850 A | 5/1995 | Nehring | |
| 5,967,880 A | 10/1999 | Major | |
| 6,101,066 A | 8/2000 | Ishihara et al. | |
| 6,150,017 A | 11/2000 | Burmeister et al. | |
| 6,650,511 B2 | 11/2003 | Hsiao et al. | |
| 6,927,951 B2 | 8/2005 | Huha et al. | |
| 6,998,175 B2 | 2/2006 | Murata et al. | |
| 7,059,760 B2 | 6/2006 | Mehta et al. | |
| 7,223,922 B2 | 5/2007 | Bandy, IV et al. | |
| 7,285,846 B1 | 10/2007 | Tran | |
| 7,525,047 B2 | 4/2009 | Iben et al. | |
| 7,566,749 B2 * | 7/2009 | Fischer et al. | 524/496 |
| 8,107,196 B2 * | 1/2012 | Bandy et al. | 360/234.7 |
| 8,343,386 B2 * | 1/2013 | Bandy et al. | 252/518.1 |
| 8,445,789 B2 * | 5/2013 | Iben et al. | 174/259 |
| 2002/0190426 A1 | 12/2002 | Seidner et al. | |
| 2003/0218851 A1 | 11/2003 | Harris et al. | |
| 2006/0018070 A1 | 1/2006 | Iben | |

(Continued)

OTHER PUBLICATIONS

Non-Final Office Action Summary from U.S. Appl. No. 12/852,428 dated Jun. 28, 2012.

(Continued)

*Primary Examiner* — Kevin Bernatz
(74) *Attorney, Agent, or Firm* — Zilka-Kotab, PC

(57) ABSTRACT

A system, in one embodiment, includes an ESD adhesive operatively coupled to leads of an electronic device for providing ESD protection thereto, the ESD adhesive including a mixture of a polymeric thin film and electrically conductive fillers dispersed in the polymeric thin film, and has a structural characteristic of being formed through at least partial evaporation of a solvent therefrom and being substantially free of agglomerates of the electrically conductive fillers. In another embodiment, a method for providing ESD protection to an element of an electronic device includes preventing formation of agglomerates of electrically conductive fillers in an ESD adhesive that includes a polymeric thin film, the electrically conductive fillers dispersed therein, and a solvent by subjecting the ESD adhesive to high-energy mixing during formation thereof, applying the ESD adhesive across exposed leads, such as leads of a cable, PCB, or other substrate, and evaporating solvent from the ESD adhesive.

13 Claims, 13 Drawing Sheets

(56) References Cited

U.S. PATENT DOCUMENTS

| | | |
|---|---|---|
| 2006/0098351 A1 | 5/2006 | Iben |
| 2007/0036970 A1 | 2/2007 | Stumphauzer et al. |
| 2007/0146941 A1 | 6/2007 | Harris et al. |
| 2008/0268206 A1 | 10/2008 | Maldonado Arellano |
| 2009/0104438 A1 | 4/2009 | Lalli et al. |
| 2009/0242823 A1 | 10/2009 | Kanakarajan et al. |
| 2009/0288864 A1* | 11/2009 | Iben et al. ............ 174/259 |
| 2009/0289231 A1* | 11/2009 | Bandy et al. ........... 252/511 |
| 2009/0290260 A1* | 11/2009 | Bandy et al. ......... 360/234.7 |
| 2009/0290278 A1 | 11/2009 | Iben et al. |
| 2011/0020642 A1 | 1/2011 | Yaguchi et al. |
| 2012/0033332 A1* | 2/2012 | Bandy et al. ........... 360/323 |

OTHER PUBLICATIONS

Non-Final Office Action Summary from U.S. Appl. No. 12/125,004 dated May 25, 2011.

Final Office Action from U.S. Appl. No. 12/852,428 dated Nov. 29, 2012.

* cited by examiner

LOW VISCOSITY ELECTROSTATIC DISCHARGE (ESD) DISSIPATING ADHESIVE SUBSTANTIALLY FREE OF AGGLOMERATES

BACKGROUND

The present invention relates to magnetic heads for data storage, and more particularly, this invention relates to adhesives having electrostatic discharge (ESD) dissipating properties for use with magnetic heads.

In magnetic storage systems, data is commonly read from and written onto magnetic recording media utilizing magnetic transducers. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

Magnetoresistive (MR) sensors, such as giant magnetoresistive (GMR), anisotropic magnetoresistive (AMR) and tunnel valve magnetoresistive (TMR) sensors, are used to read data written on magnetic media. MR sensors are used extensively in the hard disk drive (HDD) and tape drive industries. MR sensors are highly sensitive to damage by ESD events. This is a major problem that is encountered during manufacturing, due to handling and use of MR sheet resistors with the build-up of electrostatic charges on the various components of a head or other objects which come into contact with the MR sensors and spontaneously discharge through the MR sensor leading to damage. Static charges may be externally produced and accumulate on instruments used by persons performing head manufacturing or testing function. These static charges may also discharge through the head, causing physical and/or magnetic damage to the sensors.

One method to prevent or minimize ESD damage to MR sensors is via diode protection. Generally, the best location to attach the diodes for maximum protection is as close to the sensors as possible. In tape and HDDs, typically a flexible cable is attached to the MR sensors to allow a connection to external electrical devices. The cabled sensor modules (CMODs) are then assembled into a magnetic head which includes an actuator to move the sensor over the particular data track to be read. The actuation is high frequency, and the response of the actuation is slowed down by extra mass and cable rigidity, urging the use of smaller and smaller cables. In attaching the cables, the spacing between the cable leads can vary along the length of the cable. Furthermore, the spacing of the leads on the cable may change from one product to another. In addition, there are several manufacturing steps required to attach the diode(s) to the MR sensor, thus the possibility still exists for ESD damage to the MR sensor during any of these steps prior to the diode being attached.

Another method to prevent or minimize ESD damage to MR sensors is via conductive coatings. In prior art attempts, these coatings have been applied through screen-printing, rotogravure, and syringe dispensing. They have typically provided good adhesion, but are highly viscous (greater than about 20,000 CP) and therefore are inherently difficult to apply and place with any level of accuracy.

In any of the methods used in preventing or minimizing ESD damage to MR sensors using a conductive coating suffer from frequent agglomerates of conductive particles compromising the coating. In particular, these agglomerates form conductive bridges whenever the agglomerate spans the lead-to-lead spacing of the cable, negating the protective advantages conferred by the coating. Furthermore, as feature size, including lead-to-lead spacing, continues decreasing with advancing component technology, the likelihood of such agglomerates conferring inadequate protection or producing catastrophic failure increases, ultimately making the conventional conductive coating an inadequate solution.

BRIEF SUMMARY

According to one embodiment, a system includes an electrostatic discharge (ESD) adhesive coupled to a plurality of leads in a coverage area for providing ESD protection to at least one element of an electronic device, the ESD adhesive including a mixture of a polymeric thin film and electrically conductive fillers dispersed in the polymeric thin film, wherein the ESD adhesive has a resistance in a range from about 10 kΩ to about 100 MΩ, the coverage area is a portion of the plurality of leads where the adhesive is applied, and the ESD adhesive is a homogenous mixture substantially free of agglomerates of the electrically conductive fillers.

In another embodiment, a system includes an ESD adhesive operatively coupled to a plurality of leads of an electronic device for providing ESD protection to at least one element of the electronic device, the ESD adhesive including a mixture of a polymeric thin film and electrically conductive fillers dispersed in the polymeric thin film, wherein the ESD adhesive has a structural characteristic of being formed through at least partial evaporation of a solvent therefrom, and the ESD adhesive has a structural characteristic of being substantially free of agglomerates of the electrically conductive fillers.

In yet another embodiment, a method for providing ESD protection to an element of an electronic device includes preventing formation of agglomerates of electrically conductive fillers in an ESD adhesive by subjecting the ESD adhesive to high-energy mixing during formation thereof, wherein the ESD adhesive includes a polymeric thin film, the electrically conductive fillers dispersed in the polymeric thin film, and a solvent for controlling a viscosity of the ESD adhesive, applying the ESD adhesive across exposed leads of a cable, and evaporating at least a portion of the solvent from the ESD adhesive, wherein at least some of the leads are operatively coupled to an element of an electronic device.

According to another embodiment, an ESD adhesive includes a polymeric thin film, electrically conductive fillers dispersed in the polymeric thin film, and a solvent for controlling viscosity, wherein the ESD adhesive has a structural characteristic of being formed through at least partial evaporation of the solvent therefrom, the ESD adhesive has a resistance in a range from about 10 kΩ to about 100 MΩ after evaporation of the solvent therefrom, the ESD adhesive has a viscosity in a range from about 30 CP to about 250 CP prior to evaporation of the solvent therefrom, and the ESD adhesive is substantially free of agglomerates of the electrically conductive fillers.

Other aspects and embodiments of the present invention will become apparent from the following detailed description, which, when taken in conjunction with the drawings, illustrate by way of example the principles of the invention.

DETAILED DESCRIPTION

Figure 1:
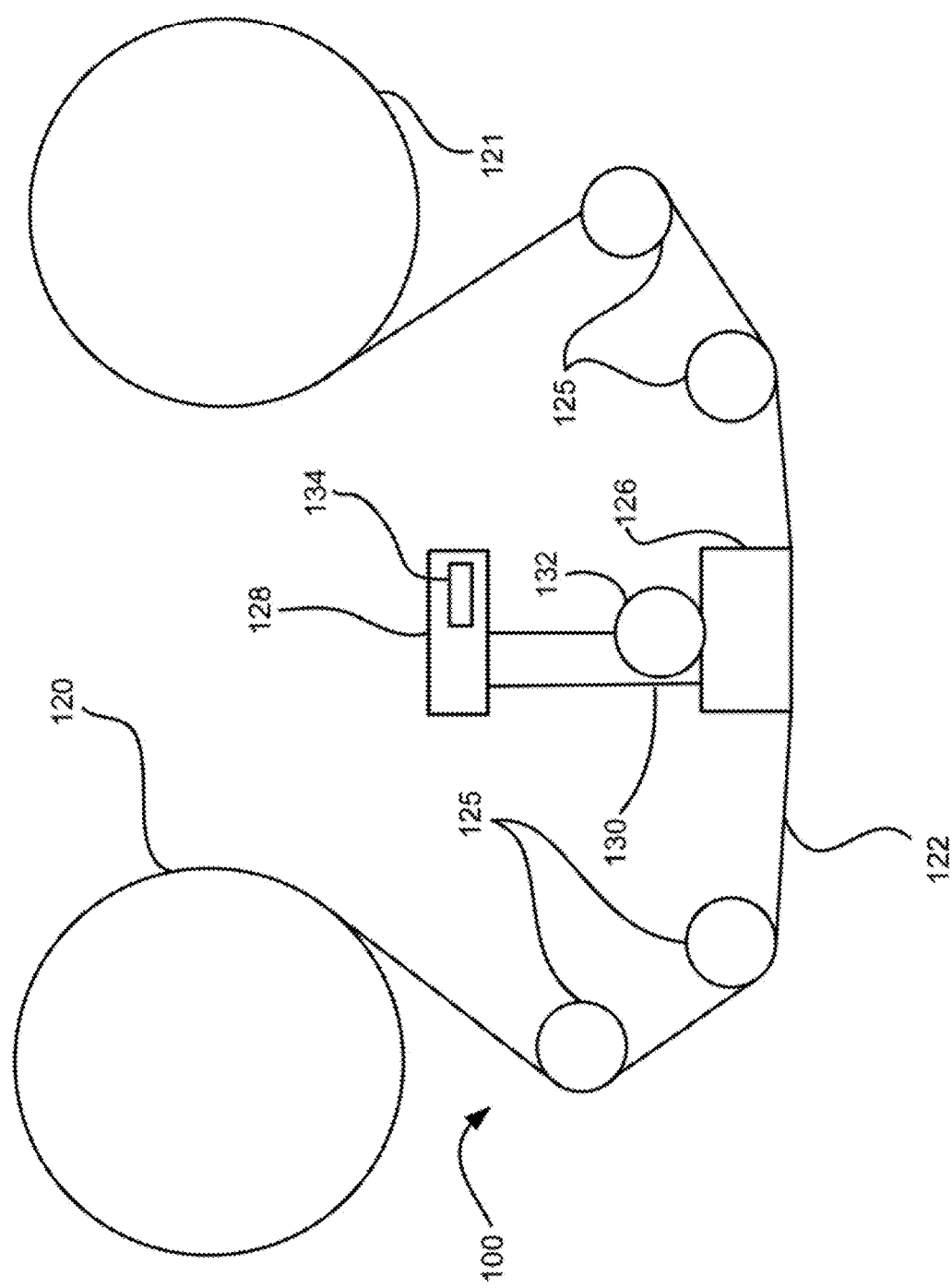
FIG. 1 is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of electrostatic discharge (ESD) dissipative adhesives, as well as operation and/or systems comprising ESD dissipative adhesives.

According to one general embodiment, a system includes an ESD dissipative adhesive coupled to a plurality of leads in a coverage area for providing ESD protection to at least one element of an electronic device, the ESD adhesive including a mixture of a polymeric thin film and electrically conductive fillers dispersed in the polymeric thin film, wherein the ESD adhesive has a resistance in a range from about 10 kΩ to about 100 MΩ, the coverage area is a portion of the plurality of leads where the adhesive is applied, and the ESD adhesive is a homogenous mixture substantially free of agglomerates of the electrically conductive fillers.

In another general embodiment, a system includes an ESD adhesive operatively coupled to a plurality of leads of an electronic device for providing ESD protection to at least one element of the electronic device, the ESD adhesive including a mixture of a polymeric thin film and electrically conductive fillers dispersed in the polymeric thin film, wherein the ESD adhesive has a structural characteristic of being formed through at least partial evaporation of a solvent therefrom, and the ESD adhesive has a structural characteristic of being substantially free of agglomerates of the electrically conductive fillers.

In yet another general embodiment, a method for providing ESD protection to an element of an electronic device includes preventing formation of agglomerates of electrically conductive fillers in an ESD adhesive by subjecting the ESD adhesive to high-energy mixing during formation thereof, wherein the ESD adhesive includes a polymeric thin film, the electrically conductive fillers dispersed in the polymeric thin film, and a solvent for controlling a viscosity of the ESD adhesive, applying the ESD adhesive across exposed leads of a cable, and evaporating at least a portion of the solvent from the ESD adhesive, wherein at least some of the leads are operatively coupled to an element of an electronic device.

According to another general embodiment, an ESD adhesive includes a polymeric thin film, electrically conductive fillers dispersed in the polymeric thin film, and a solvent for controlling viscosity, wherein the ESD adhesive has a structural characteristic of being formed through at least partial evaporation of the solvent therefrom, the ESD adhesive has a resistance in a range from about 10 kΩ to about 100 MΩ after evaporation of the solvent therefrom, the ESD adhesive has a viscosity in a range from about 30 CP to about 250 CP prior to evaporation of the solvent therefrom, and the ESD adhesive is substantially free of agglomerates of the electrically conductive fillers.

According to one embodiment, a low viscosity ESD dissipating adhesive, referred to herein as an ESD adhesive, may be added to a location on a cable attached to an MR sensor in a magnetic head where a thin film of the ESD adhesive may be laid over the read/write transducers, thereby providing ESD protection to these elements. Note that while the lead containing substrate discussed herein is generally referred to as a cable, and primarily a flexible cable, other substrates, such as a printed circuit board (PCB), transistor leads of a magnetic head, other substrates containing leads, etc., may make use of the ESD adhesives described herein according to various embodiments. According to various embodiments, this ESD adhesive, when applied in an advantageous location, may be used as a standalone ESD protection or may be used in conjunction with diode protection or other protection methods as known to those skilled in the art.

Some prior attempts to use adhesives for ESD protection have failed due to the adhesives' viscosity and/or conductivity, which were too high, and thus adequate ESD protection was never achieved.

Still other attempts to use adhesives for ESD protection have failed due to the presence of agglomerates comprising conductive particles, which serve as conductive bridges when spanning lead-to-lead spacing and connecting conductive leads, thereby negating the protective effects of the ESD adhesive with respect to those leads.

According to one embodiment, a thin low viscosity film is prepared in a way to remove any agglomerates of one or more conductive fillers via a high-energy mixing process carried out during formulation, and subsequently applied over exposed leads for devices sensitive to ESD events, such as read and/or write transducer leads on a cable. The resulting ESD film having the one or more conductive fillers allows for the dissipation of an ESD event, whereby the current is minimally or not passed through any MR sensors and no damage to the MR sensors results from the ESD event.

In preferable embodiments, the choice of materials for the ESD adhesive enables a manufacturing process which achieves a desired resistance for the cable connections (due to geometries and materials of construction) which are not achievable otherwise.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive and a host (integral or external) to send and receive the data and for controlling the operation of the tape drive and communicating the status of the tape drive to the host, all as will be understood by those of skill in the art.

Figure 2:
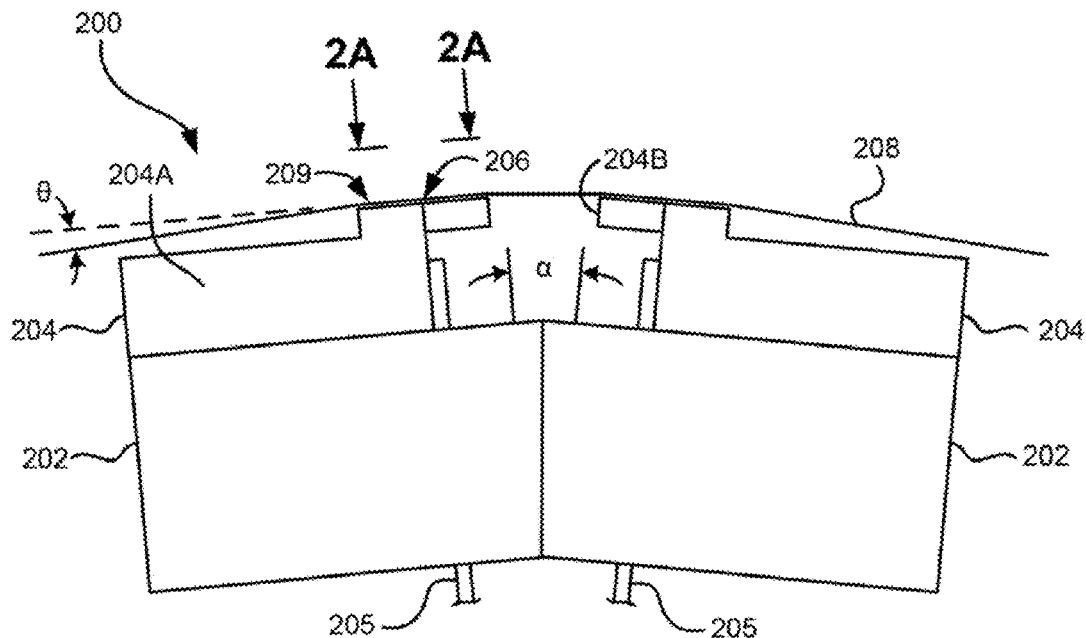
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers. Cables 205 couple the readers and/or writers 206 to a controller.

Tape heads with read, write, and servo elements exemplify the concept of an electronic device with multiple elements requiring different diode types. For example, inductive writers do not require diode protection, and attaching diodes across the leads of a writer element will often be deleterious to the writer performance, as the diodes will shunt current away from the writers, decreasing the writer currents for a given applied voltage/current. Often, servo and reader elements operate under different current/voltage (IV) characteristics and thus require different diode designs. Therefore, a single diode chip which is capable of being used with a variety of magnetic head designs and could be wired to the magnetic head in a particular way to avoid negative consequences of attaching diodes across certain elements would be preferable.

Figure 2A:
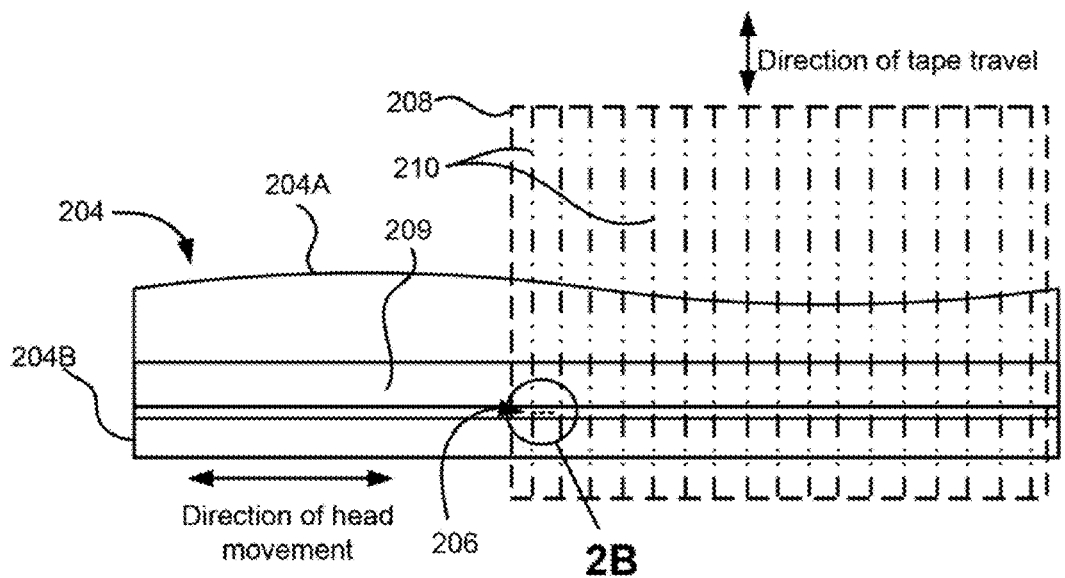
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4-22 data bands, e.g., with 16 data bands and 17 servo tracks 210, as shown in FIG. 2A on an e.g., one-half inch wide tape 208. Current LTO products include 4 data bands and 5 servo tracks. The data bands are defined between servo tracks 210. Each data band may include a number of data tracks, for example 96 data tracks (not shown). During read/write operations, the readers and/or writers 206 are positioned within one of the data bands. Outer readers, sometimes called servo readers, read the servo tracks 210. The servo signals are in turn used to keep the readers and/or writers 206 aligned with a particular track during the read/write operations.

Figure 2B:
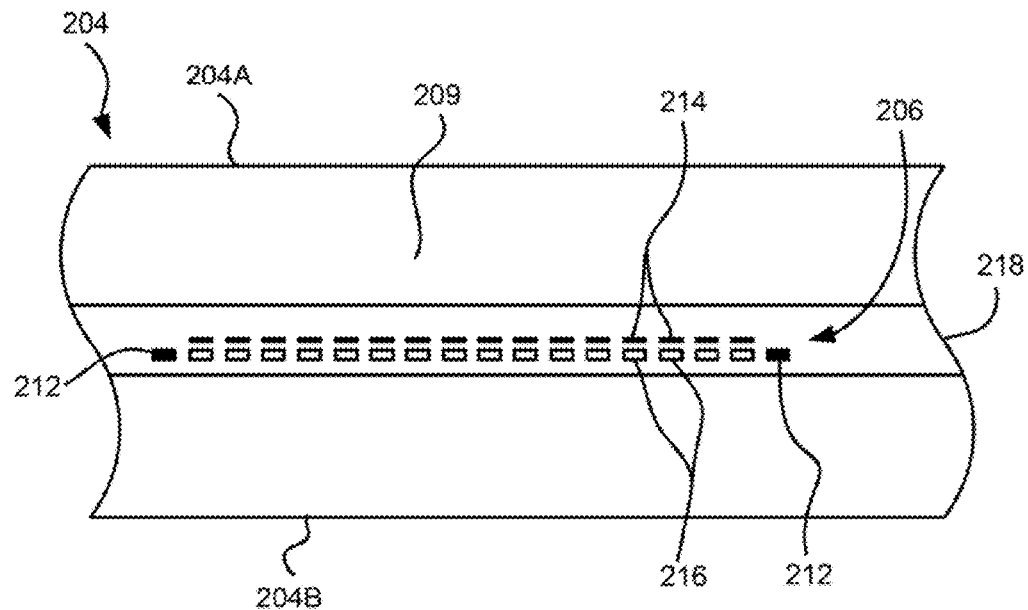
FIG. 2B is a detailed view taken from Circle 2B of FIG. 2A.

FIG. 2B depicts a plurality of readers and/or servos and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 33, 40, 64, 66, etc. readers and/or writers 206 per array. A preferred embodiment includes 33 readers per array and/or 33 writers per array, 32 of which are used for forward and 32 for reverse tape motion. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
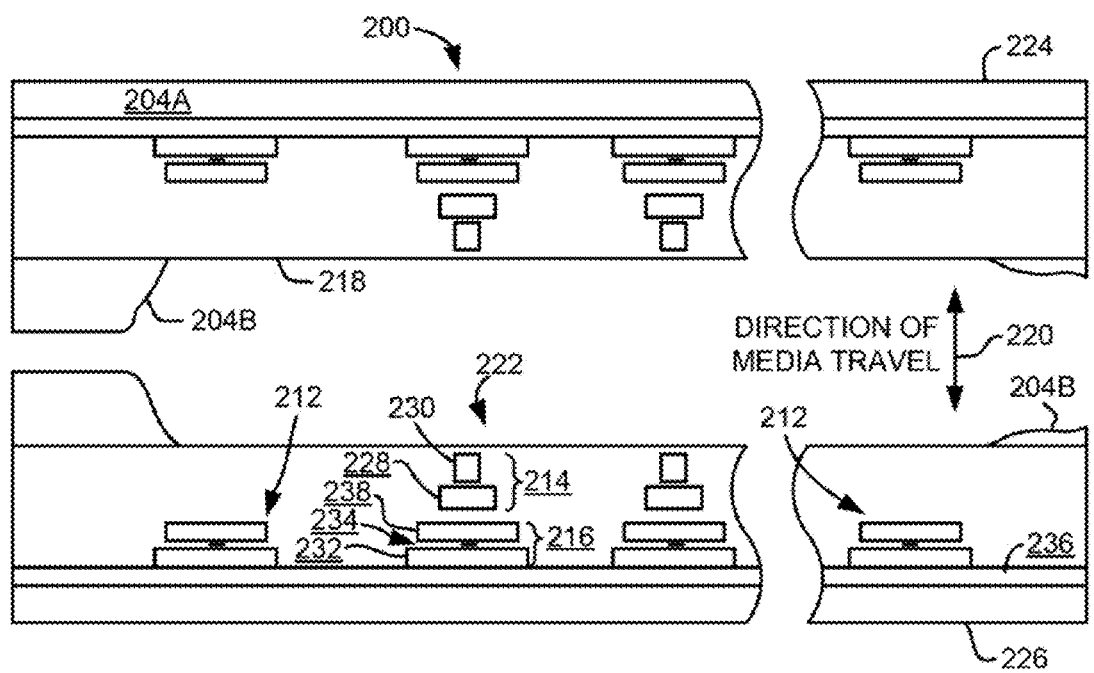
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art.

The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 3A:
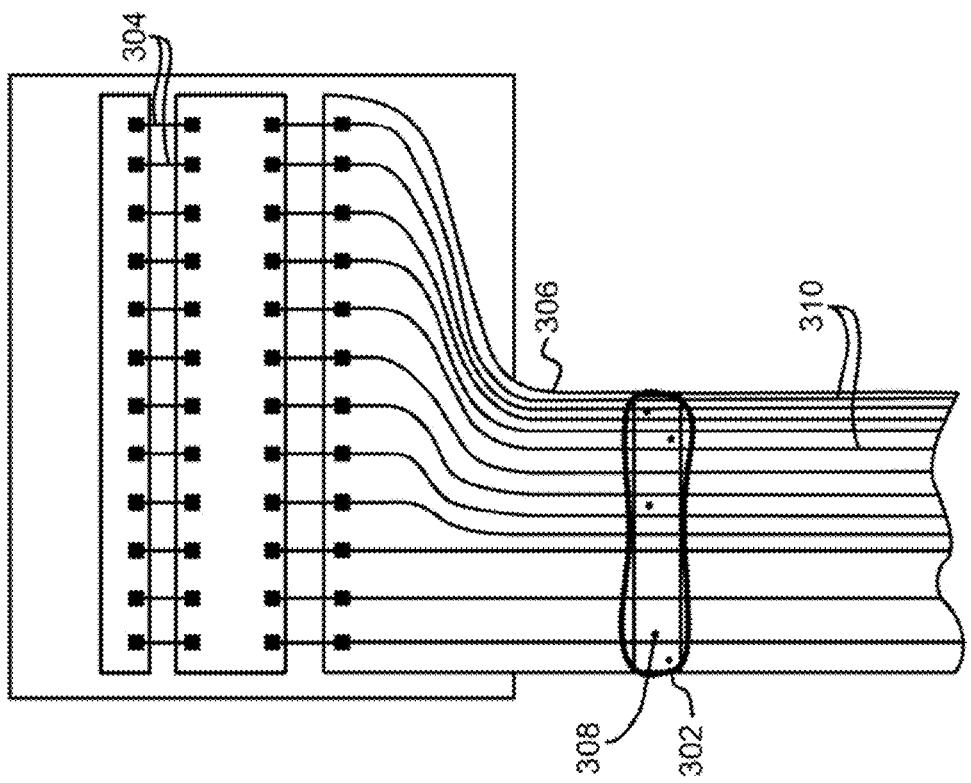
FIG. 3A illustrates an ESD adhesive having agglomerates of conductive fillers applied to a cable with contact leads.

Now referring to FIG. 3A, a conventional ESD adhesive 302 as applied to a set of cable leads 310 of a magnetic head is shown. The ESD adhesive 302 is sometimes referred to as a film in this disclosure, as it is not a requirement that the ESD adhesive 302 actually include any adhesive at all. However, it is an adhesive in terms of adhering to the surface to which it is applied. The ESD adhesive 302 may be applied in a position where read and/or write transducer leads 304 are exposed, and/or over exposed leads 310 of a cable 306, as shown. In one approach, a thin film of ESD adhesive 302 may be applied over a window in the cable 306 in which the cable leads 310 are exposed to provide ESD protection to sensitive elements of the magnetic head. Of course, this ESD adhesive 302 may be used in any application which would benefit from the ESD dissipative properties of the ESD adhesive 302. A preferred location is in a window of the cable 306 that exposes the cable leads 310.

Disadvantageously, in some instances, the ESD adhesive 302 may be formed in a manner which allows for one or more agglomerates 308 of conductive fillers to form in the ESD adhesive 302. Worse, in many cases, such as the instance shown in FIG. 3A, the agglomerates 308 may span one or more exposed cable leads 310 (indicated as agglomerate 312) and/or transducer leads 304, effectively connecting the leads by a conductive bridge. This lead-to-lead connection results in poor product performance and other undesirable events.

Figure 3B:
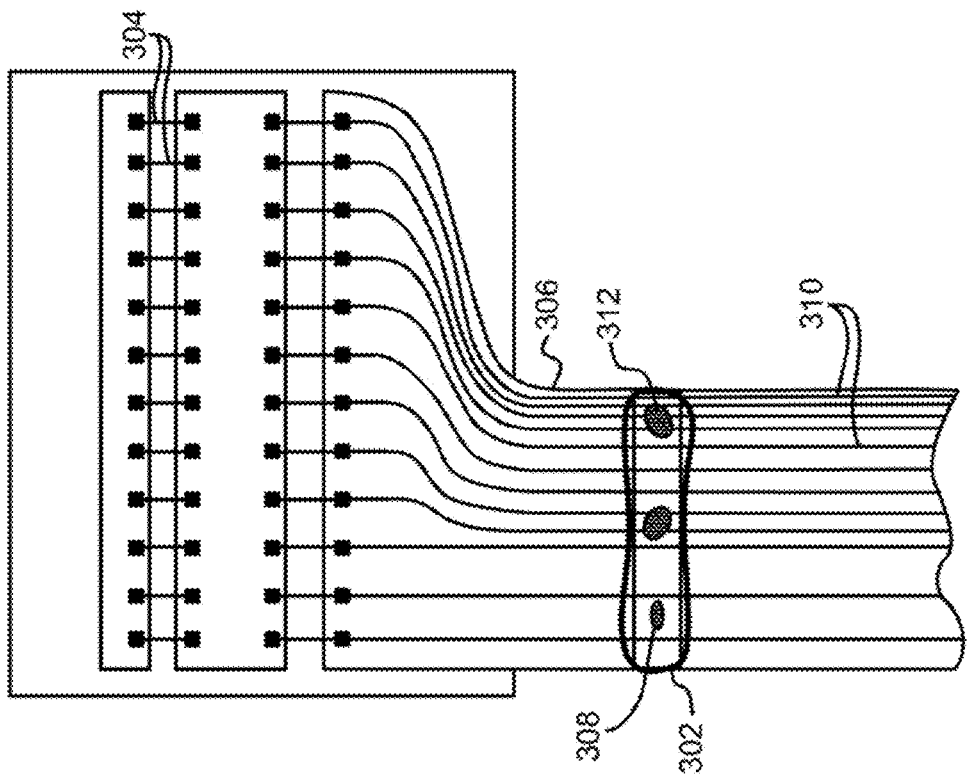
FIG. 3B illustrates an ESD adhesive substantially free of agglomerates applied to a cable with contact leads, according to one embodiment.

Now referring to FIG. 3B, an ESD adhesive 302 as applied to a cable 306 of a magnetic head is shown according to one embodiment. An advantageous location for application of the ESD adhesive 302, according to some approaches, is in a position where read and/or write transducer leads 304 are exposed or a window in the cable 306 where cable leads 310 are exposed, and a thin film of ESD adhesive 302 may be laid over these exposed cable leads 310 and/or transducer leads 304. The example in FIG. 3B is from an IBM LTO-5 half height (HH) drive and accompanying cable. However, any cable type may be used, such as full height cables, window cables, etc., or any other device which would benefit from the ESD dissipative properties of the ESD adhesive 302, as would be understood by one of skill in the art upon reading the present descriptions.

In the prior art, attempts have been made to provide a material which could provide ESD protection to elements of electronic devices that could be applied to leads. However, these prior attempts have all failed due to either the material being too viscous and not providing enough surface area contact with the leads, or the material having too high of a resistivity, thereby not providing ESD protection to elements of the electronic device, since the resistive path through the elements was less than the resistive path through the material.

As can be seen from FIG. 3B, the ESD adhesive 302 may be used to provide ESD protection to at least one element of an electronic device. In one embodiment, the at least one element of the electronic device may be a reader and/or writer transducer of a magnetic head, and in a more specific embodiment, the at least one element of the electronic device may be a read transducer of a magnetic head.

The distance between exposed read and/or write transducer leads 304 and cable leads 310 are very small. As a result, prior art adhesives having higher viscosities do not flow adequately in between the leads 304, 310, and even ESD adhesives having adequately low viscosity to permit proper flow between leads 304, 310 may still be plagued by agglomerates 308, 312, some of which may span the distance between leads 304, 310 and defeat ESD protection. Moreover, inadequate flow of prior art adhesive reduces the amount of surface contact between the exposed leads 304, 310. Additionally, cured epoxies form a skin on exterior surfaces thereof, resulting in a surface that is no longer conductive, which therefore can no longer provide conductive protection to the elements coupled to the leads.

Each of the plurality of leads may be separated by a lead-to-lead spacing, and in contrast to conventional ESD adhesives, the ESD adhesives described herein, according to various embodiments, include electrically conductive fillers dispersed in a polymeric thin film. The electrically conductive fillers dispersed in the polymeric thin film may be characterized as having an average particle size that is less than the lead-to-lead spacing, according to preferred embodiments.

In one preferred approach, an ESD adhesive 302 may include a polymeric thin film, electrically conductive fillers dispersed uniformly throughout the polymeric thin film, and a solvent for controlling viscosity of the ESD adhesive 302. The ESD adhesive 302 may have a resistivity in a range from about 10 kΩ to about 100 MΩ, depending on characteristics of the electronic device to which the elements are connected. For some magnetic tape storage devices, an acceptable range of resistive connections to balance ESD protection (which is not effective if the resistance is too high) against degrading drive performance (if the resistance is too low) may be between about 50 kΩ and about 10 MΩ in one approach, and may have a structural characteristic of being formed through high-energy mixing of the polymeric thin film and conductive fillers to facilitate homogenous dispersion of the conductive fillers throughout the polymeric thin film, followed by at least partial evaporation of the solvent therefrom. Also, the ESD adhesive 302 may have a viscosity in a range from about 10 CP to about 2000 CP prior to evaporation of the solvent therefrom, and more preferably in a range from about 30 CP to about 250 CP prior to evaporation of the solvent therefrom, in some embodiments, thereby enabling the ESD adhesive 302 to flow around a surface area of the plurality of leads in a coverage area. The coverage area is a portion of the plurality of leads where the ESD adhesive 302 is applied. A structural characteristic of being formed through at least partial evaporation of the solvent therefrom includes having the ability to flow around the leads of the cable properly to allow for sufficient surface area coverage so as to provide enough contact that the resistivity of the ESD adhesive 302 is not inhibitive of protecting the elements of the electronic device.

The solvent, according to various embodiments, may comprise at least one of: xylene, toluene, and tetrahydrofuran (THF). The polymeric thin film, according to various embodiments, may comprise at least one of: a polyurethane compound, a polyester compound, a polyacrylate compound, a polymethacrylate compound, an epoxy compound, among others as would be known to those skilled in the art. The electrically conductive fillers, according to various embodiments, may comprise at least one of: carbon black, carbon nanotubes, silver nanoparticles, gold nanoparticles, grapheme nanoparticles, fullerene compounds, among others as would be known to those skilled in the art.

A system may comprise the ESD adhesive 302 coupled to a plurality of leads in a coverage area (a portion of the plurality of leads where the adhesive is applied) for providing ESD protection to at least one element of an electronic device. The ESD adhesive 302 in this and some other embodiments comprises a mixture of a polymeric thin film and electrically conductive fillers dispersed in the polymeric thin film. The ESD adhesive 302 has a resistivity in a range from about 50 k$\Omega$ to about 100 M$\Omega$, and is a homogenous mixture substantially free of agglomerates of the electrically conductive fillers. By substantially free of agglomerates of the electrically conductive fillers, what is meant is that agglomerates of a certain size range are vastly reduced or completely removed from the mixture. The agglomerates of a certain size range that are vastly reduced or eliminated are those having a diameter that is greater than about 2× the mean particle diameter of the electrically conductive filler particles. In addition, larger sized agglomerates are completely removed from the mixture, which includes agglomerates having a diameter that is greater than about 3× or greater than the mean particle diameter of the electrically conductive filler particles. In this way, there is virtually no chance that an agglomerate large and/or long enough to bridge the distance between adjacent leads is still present in the mixture.

In one embodiment, high-energy mixing may be used to form the ESD adhesive 302, in some preferred embodiments. The high-energy mixing may include high-speed shear mixing, for example using a mixer with counter-rotating paddles operating at approximately 4000-6000 rpm. In such an approach, conductive fillers and a polymeric thin film resin may be mixed together using the mixer for a predetermined amount of time.

In another embodiment, high-energy mixing may include milling, such as ball milling. When utilizing a milling process, conductive fillers may be milled as a dry powder to reduce particle size and facilitate uniform dispersion throughout a polymeric thin film, or may be mixed with a polymeric thin film resin by milling the conductive fillers and resin together. Moreover, it is preferable that the milling be performed using non-electrically conductive mills, so as to avoid the deposition of unwanted conductive particles into the ESD adhesive 302 during milling, for example deposition of a fragment of the mills, which may break off during milling.

In still another embodiment, the dry-powder conductive filler may be size-selectively sifted through a screen or filter of a predetermined pore size, so as to ensure homogeneous particle size and homogenous dispersion of the particles throughout a polymeric resin.

According to some embodiments, an ESD adhesive 302 may include a polymeric thin film having conductive fillers therein. The polymeric thin film may be of any type, such as polyurethane, a poly n-vinyl acetate, polyethylene, a step or chain growth polymer, etc., or any other polymeric thin film known to those of skill in the art. The conductive fillers may be of any type, according to various embodiments, such as carbon black, graphite, carbon nanotubes, titanium, silver, silver nanoparticles, gold, gold nanoparticles, platinum, platinum nanoparticles, combinations thereof, etc., or any other conductive filler known to those of skill in the art. The quantity of conductive fillers incorporated into the polymeric thin film may be selected to provide a desired resistivity of the ESD adhesive 302, according to one embodiment.

According to one preferred embodiment, the viscosity of the ESD adhesive 302 may be reduced via addition of a solvent to the polymeric thin film having conductive fillers therein. Any type of solvent may be used including, preferably, higher buoyancy solvents, in some embodiments. Some exemplary solvents include xylene, toluene, benzene, chlorobenzene, ethyl acetate, thinyl acetate, non-polar organic solvents, mixtures thereof, etc., or any other solvent capable of reducing a viscosity of the ESD adhesive 302 while not inhibiting ESD protection capability of the ESD adhesive 302.

Preferably, in some embodiments, the solvent may have a boiling point of about 110° C.±20° C., to provide a fairly low vapor pressure and to enable slow and uniform evaporation from the polymeric thin film, providing an acceptable homogeneous film coating. Of course, other boiling points are possible, and this value is given as an example. The provided benefits of using a solvent with a boiling point around about 110° C. may be achieved through other methods, as known to those of skill in the art.

In another embodiment, the polymeric thin film may include adhesive materials, thereby providing an adhesive characteristic to the ESD adhesive 302.

In another embodiment, silica particles and/or nanoparticles may be incorporated into the ESD adhesive 302 to increase and/or control the viscosity of the ESD adhesive 302, while simultaneously controlling the resistivity of the ESD adhesive 302.

Figure 4A:
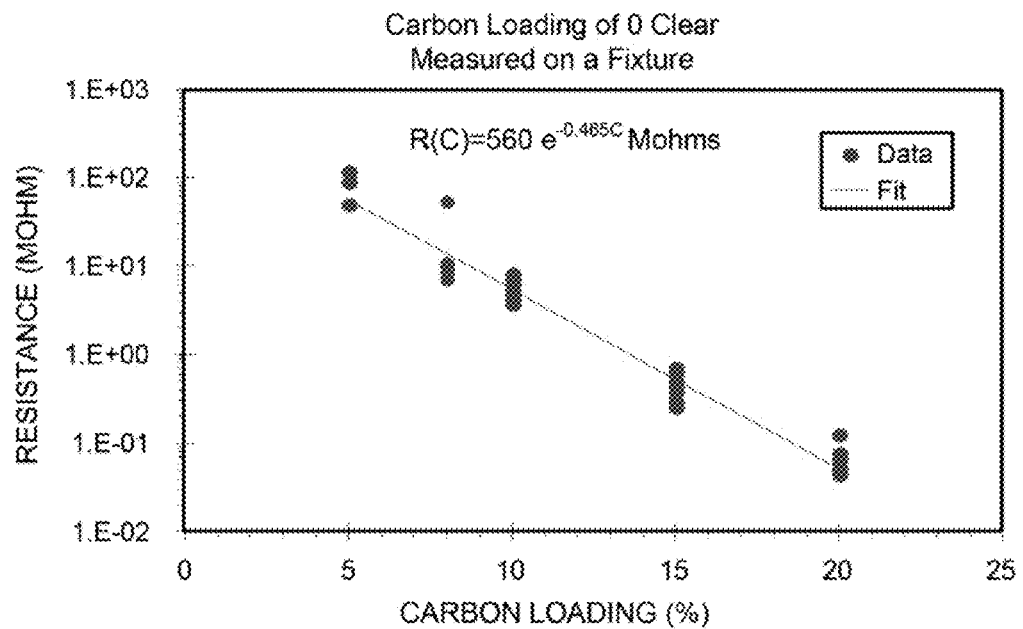
FIG. 4A is a graph showing resistance as a function of carbon loading, according to one embodiment.
Figure 4B:
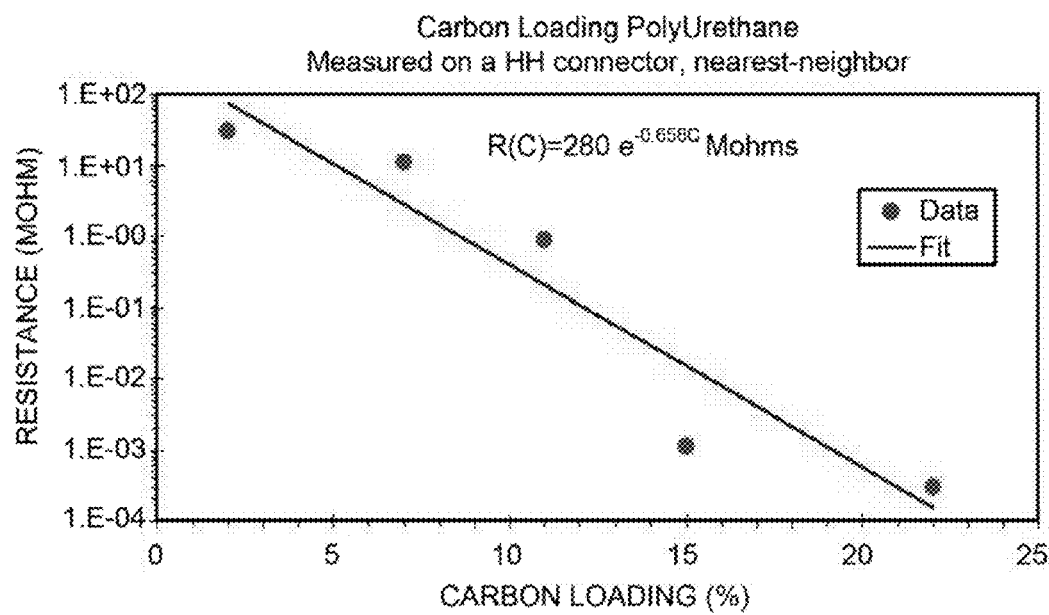
FIG. 4B is a graph showing resistance as a function of carbon loading, according to one embodiment.

In one example, a polyurethane thin film having carbon black therein was used as an ESD adhesive on a cable/magnetic head connection. As shown in FIGS. 4A-4B, a significant difference in the resistance of adhesives was observed for conductive adhesives prepared from epoxies, as shown in FIG. 4A, compared to polyurethane thin films, as shown in FIG. 4B. The resistance drop for conductive adhesives prepared from polyurethanes are significantly lower than epoxies at the same carbon loading wt %. Through this testing, it was found that a concentration of the carbon black incorporated into the polymeric thin film to achieve an acceptable resistivity of the ESD adhesive may range from about 0.1 wt % to about 25 wt %, preferably between about 1.0 wt % to about 4.0 wt %, and most preferably from about 1.5 wt % to about 2.5 wt %, according to various embodiments.

In some embodiments, the ESD adhesive may be characterized as having a sheet resistivity from about 0.8 M$\Omega$/sq to about 3.1 M$\Omega$/sq after application of the ESD adhesive to a structure, such as about sheet resistivity from about 1.0 M$\Omega$/sq to about 2.5 M$\Omega$/sq in some approaches.

In another embodiment, properties of the ESD adhesive may be tailored based on a mixing time, milling time, shearing time, etc. For example, the longer the ESD adhesive is mixed, the higher the sheet resistance will become resulting in lower conductivity of the ESD adhesive.

This allows the system to be tuned, as it's easier to be accurate at 4 wt %, and when the carbon black concentration is decreased to 2 wt % the percolation limit is approached. The resistance of a 4 wt % carbon black concentration may be controlled by mixing it for a longer time to dial-it-in to the sheet resistivity desired for the process.

Figure 5:
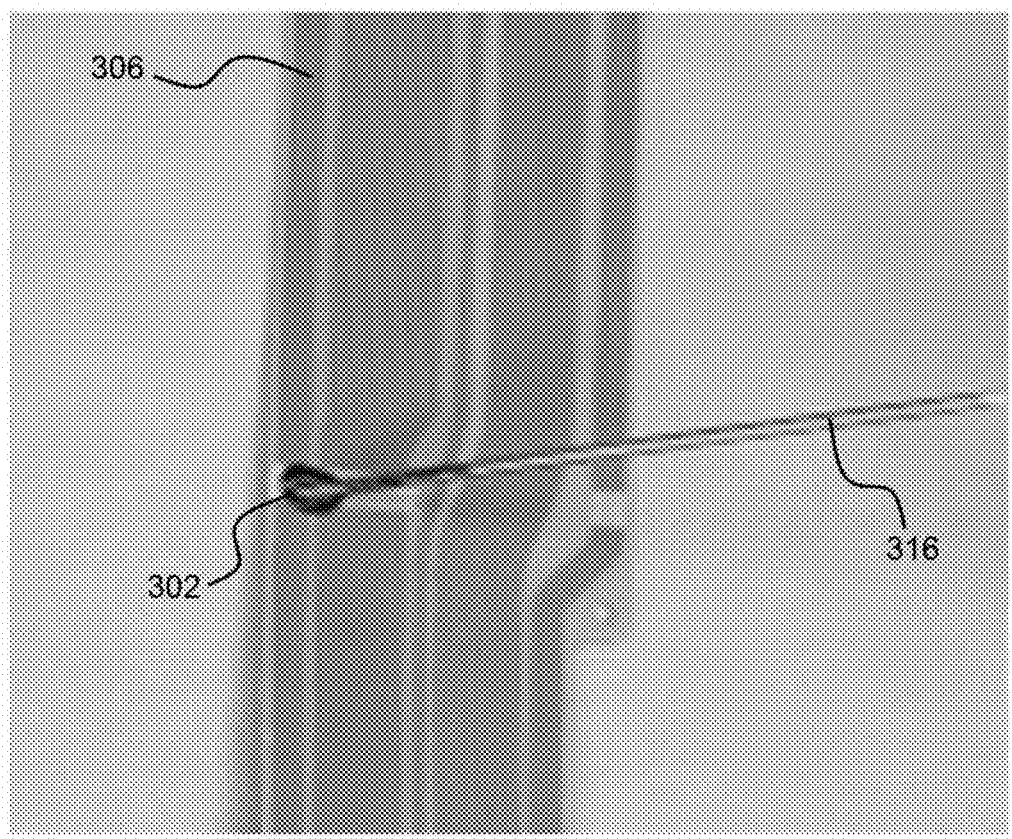
FIG. 5 is an image demonstrating how an ESD adhesive may be applied to a cable, according to one embodiment.

FIG. 5 demonstrates how an ESD adhesive 302 may be applied to a cable 306 for providing ESD protection to sensitive elements coupled to the cable 306. In this example, the ESD adhesive 302 is applied with a syringe 316, but any application technique as would be known to one of skill in the art may be used. Since syringe application of adhesives is commonly used in magnetic head manufacturing, this application method may be preferred over others, but the invention is not so limited. Other application techniques include painting the ESD adhesive 302 onto exposed leads of the cable 306, auto-dispensing the ESD adhesive 302 onto a portion of the cable 306 (such as a window in the cable where cable leads are exposed), using a silk screening process (of a type known in the art) to apply the ESD adhesive 302 to the exposed leads of the cable 306, etc.

For tape drives, an acceptable minimum lead-to-lead resistance after application of the ESD adhesive may be about 100 k$\Omega$, in one approach. Though smaller values may be used, 100 k$\Omega$ is a conservative value that may be applied broadly across many platforms. An upper limit for dissipation in a reasonable time may be determined by using an RC time constant and using the capacitance of the device to ground, in one approach. For a floating cable, the capacitance to a tester may be several pF. With a desire to dissipate within about 1 ms, and assuming a 10 pF capacitance to ground, an upper limit in the dissipation resistance may be: 1 ms/10 pF=100 M$\Omega$. Inexpensive ohm meters can measure resistances of the order of several M$\Omega$, so an upper limit of about 10 M$\Omega$ to about 20 M$\Omega$ would allow one to easily and cheaply test whether the dissipative adhesive connection is formed, in one approach.

An acceptable resistivity of the ESD adhesive may range from about 10 k$\Omega$ to about 100 M$\Omega$, more preferably between about 50 k$\Omega$ and about 10 M$\Omega$, according to various embodiments. In one embodiment, a resistivity between adjacent leads through the ESD adhesive may be about 50 k$\Omega$ or greater, such as about 100 k$\Omega$, about 1 M$\Omega$, about 5 M$\Omega$, etc. The resistivity for this exemplary ESD adhesive was better than the resistivity of carbon-filled epoxies. This is thought to be due to the viscosity of the ESD adhesives, which is lower than that of carbon-filled epoxies.

Figure 6:
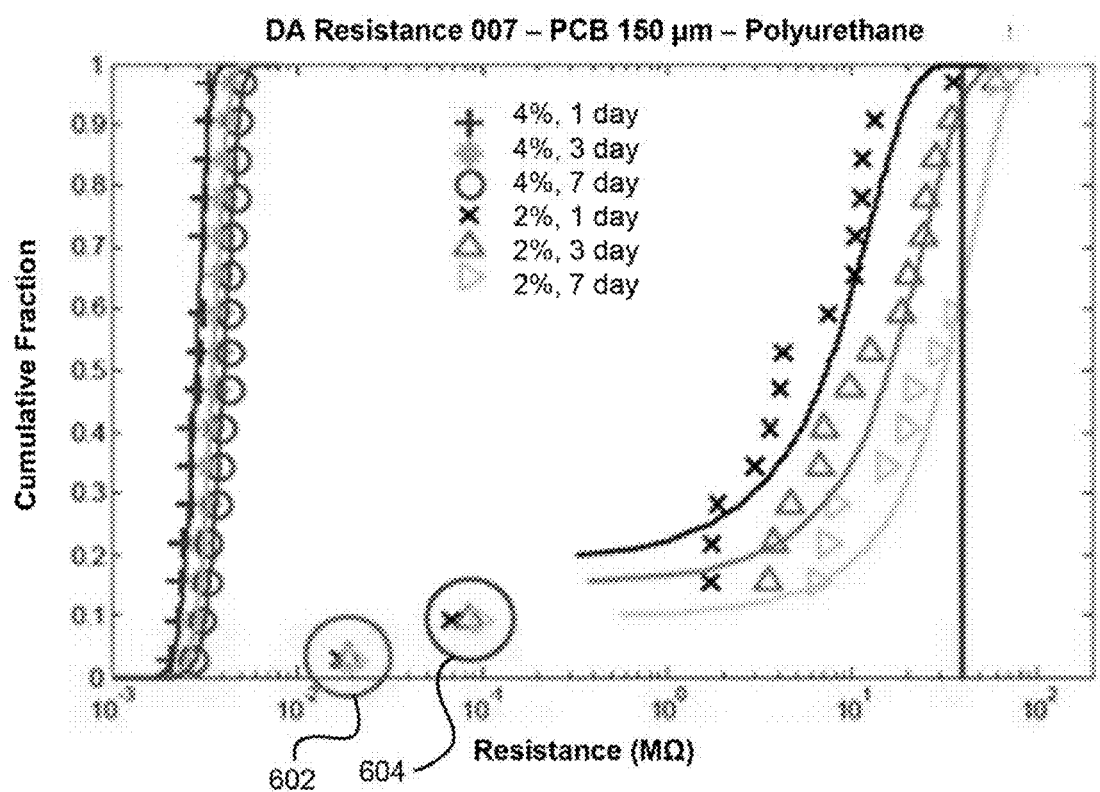
FIG. 6 shows resistance values as a function of electrically conductive filler particle concentration and time for conventional ESD adhesives produced using a low-energy mixing process.

As shown in FIG. 6, the cumulative fraction of resistances at 1, 3, and 7 days after applying an ESD adhesive prepared using a conventional low energy mixing process (magnetic stir bar) to a cable with carbon concentrations of 4% and 2% is shown, where the cable was characterized by having a spacing of about 0.15 mm between leads. The 4% carbon mixture had a resistance of about 15 k$\Omega$, while the 2% carbon had a resistance of between about 2 M$\Omega$ and 20 M$\Omega$ one day after application. In the 4% carbon, two agglomerates were present, yielding a corresponding resistance value of between 20 k$\Omega$ and 100 k$\Omega$. These agglomerates would therefore be problematic in embodiments using a 4% carbon mixture, and would greatly affect embodiments using a 2% carbon mixture by producing low resistance outlier regions on the cable.

Figure 7A:
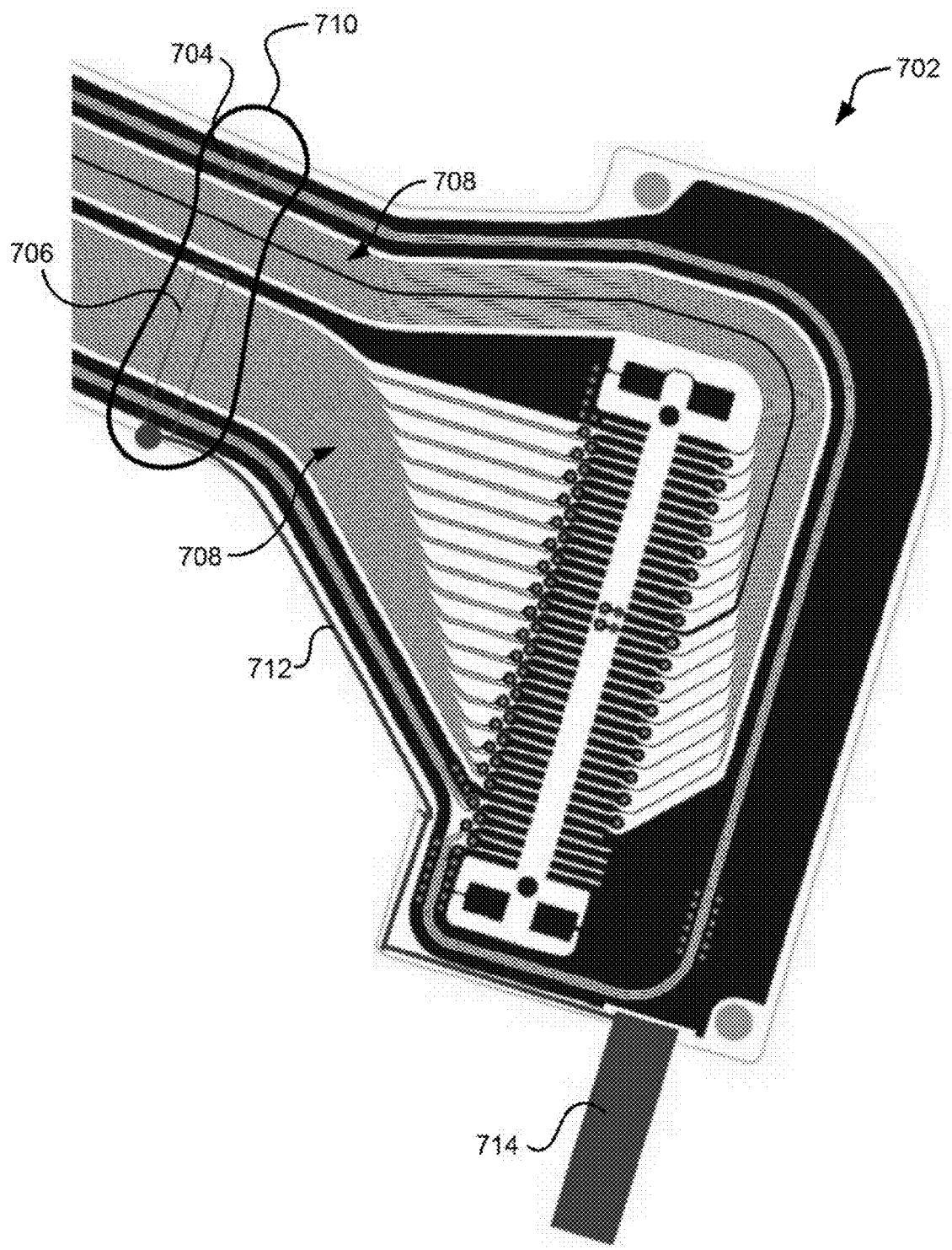
FIG. 7A illustrates a cable, according to one embodiment.
Figure 7B:
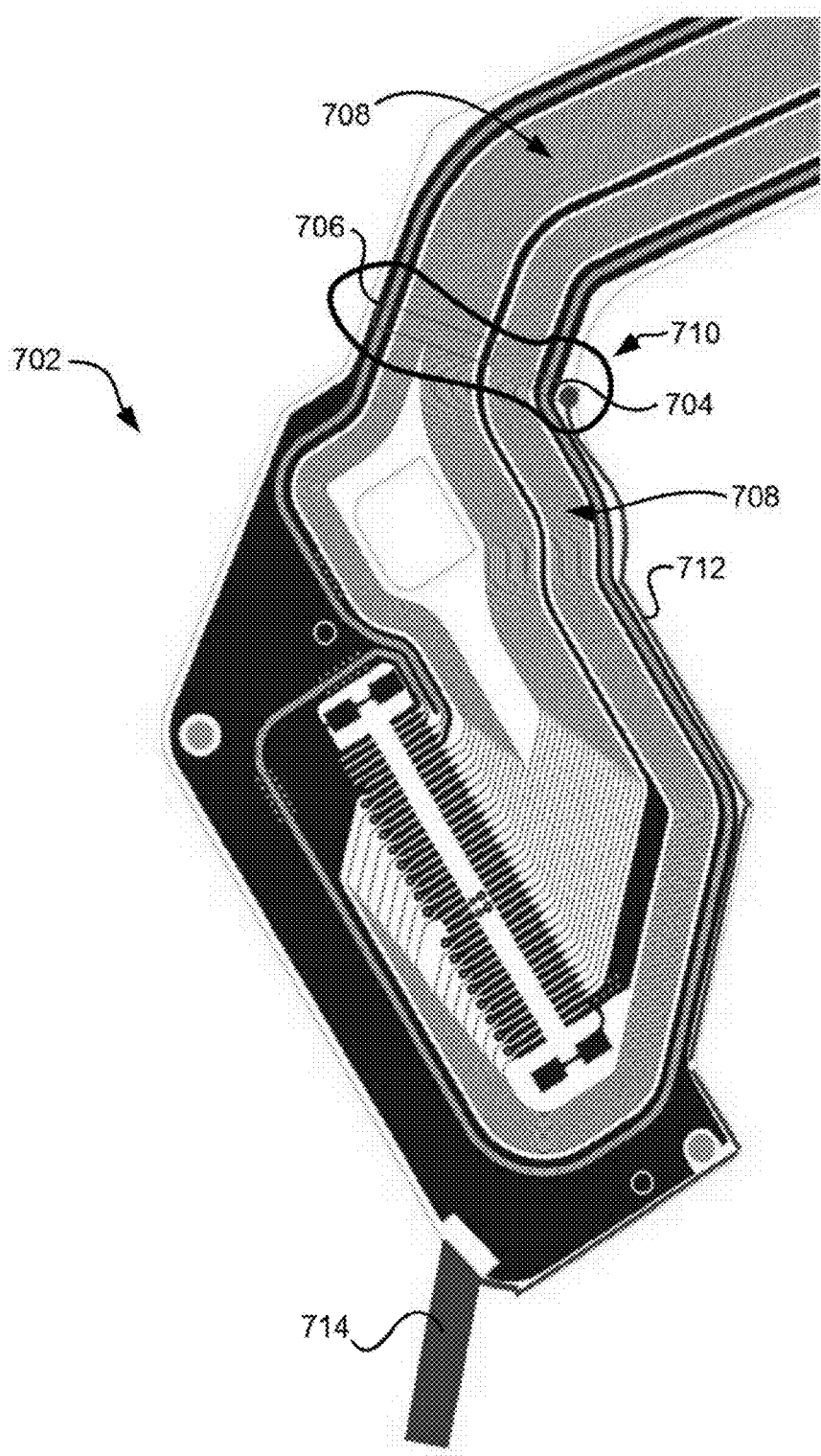
FIG. 7B illustrates a cable, according to one embodiment.

With reference to FIGS. 7A-7B, two cables 702 are shown according to various embodiments. These cables 702 may include one or more windows 704, 706, for accessing leads 708 to one or more of the servos, readers, ground traces, etc. The windows 704, 706 in the cable 702, which expose the leads 708, are available for applying an ESD adhesive 710 across, thereby covering the leads 708 and providing ESD protection to the sensitive elements during manufacturing and use, in one approach. This application of the ESD adhesive 710 may be in addition to or instead of an application across the solder pad, according to various embodiments.

Figure 7C:
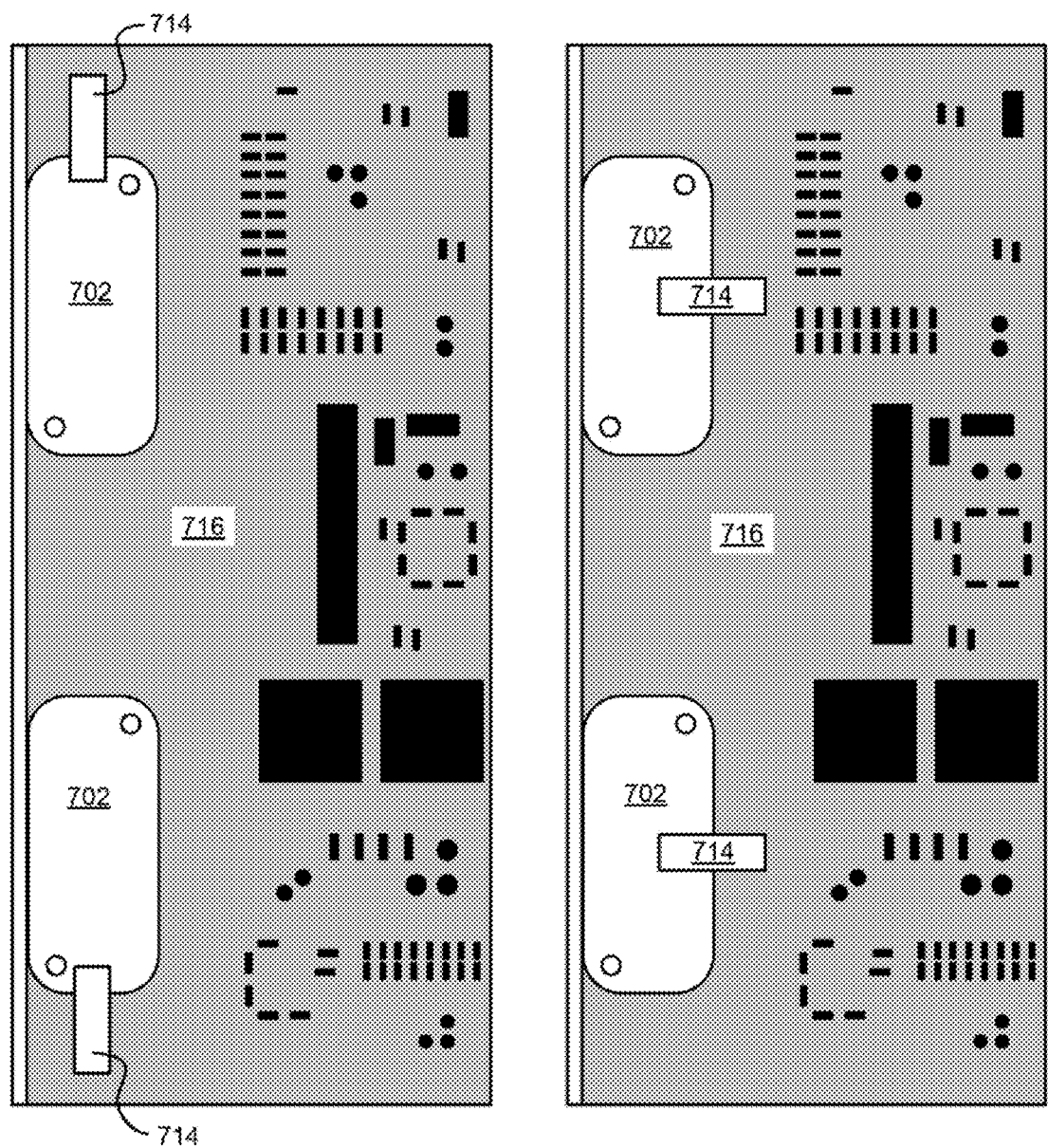
FIG. 7C illustrates a cable interfacing with a circuit board, according to one embodiment.

In one approach, a DA grounding lead 712 is provided with the cable 702, and this lead 712 may also be exposed by a window 704, 706 and may be coupled to a tab 714 for grounding the ESD adhesive 710 once it is applied, thereby grounding elements of an electronic device. This may be accomplished by coupling the tab 714 to a ground on a circuit board 716, as shown in FIG. 7C. There are various positions available for placement of the tab 714, and a few of those are shown in FIG. 7C. Of course, the actual configuration and layout of the cable 702 and the circuit board 716 may dictate which placement is preferred over another, according to some approaches.

In some approaches, the cable 702 may include a grounding lead 712 coupled to a ground of the electronic device for grounding the at least one element of the electronic device through the ESD adhesive 710. In further approaches, the grounding lead 712 may be an integral part of the cable 702 located at least partially beneath a sheath covering the cable 702. For example, the grounding lead 712 may run beneath a cable sheathing until it reaches an end of the cable 702 at which point it may be exposed, thereby allowing the grounding lead 712 to be grounded.

Figure 8:
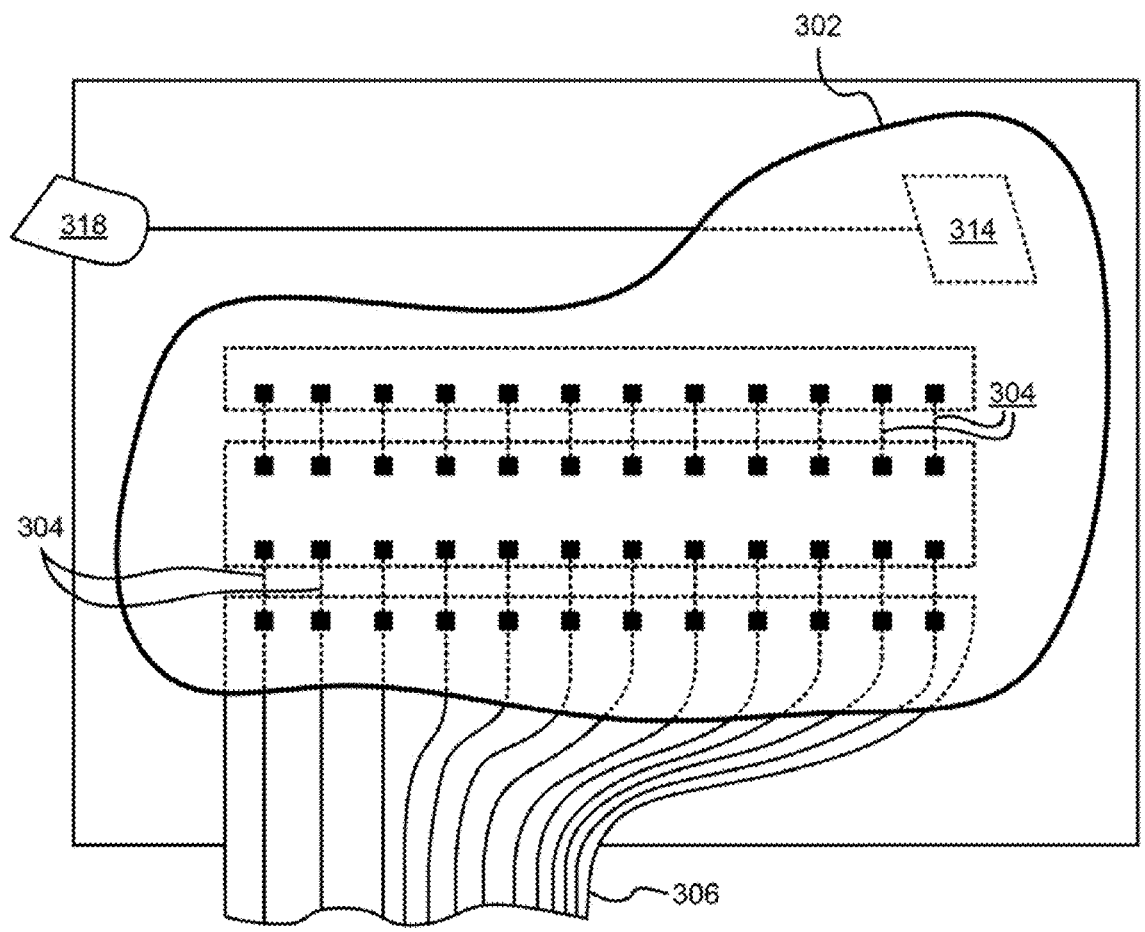
FIG. 8 illustrates an ESD adhesive applied to a modified cable with contact leads, according to one embodiment.

As shown in FIG. 8, to dissipate charge from the ESD adhesive 302, cables which are commonly used in magnetic head manufacturing may be used with only very minor modifications. In one embodiment, a portion of the polyimide film (such as a KAPTON film) may be removed from the cable 306 to expose a stainless steel stiffener 314 beneath. The ESD adhesive 302 may be placed over the exposed stainless steel stiffener 314 allowing charges to be drawn from the ESD adhesive 302 to a ground 318. This application of the ESD adhesive 302 onto the stainless steel stiffener 314 may be performed at the same time that the ESD adhesive 302 is applied to the exposed leads 304, or at any other time during the manufacturing process, as would be known to one of skill in the art.

Figure 9:
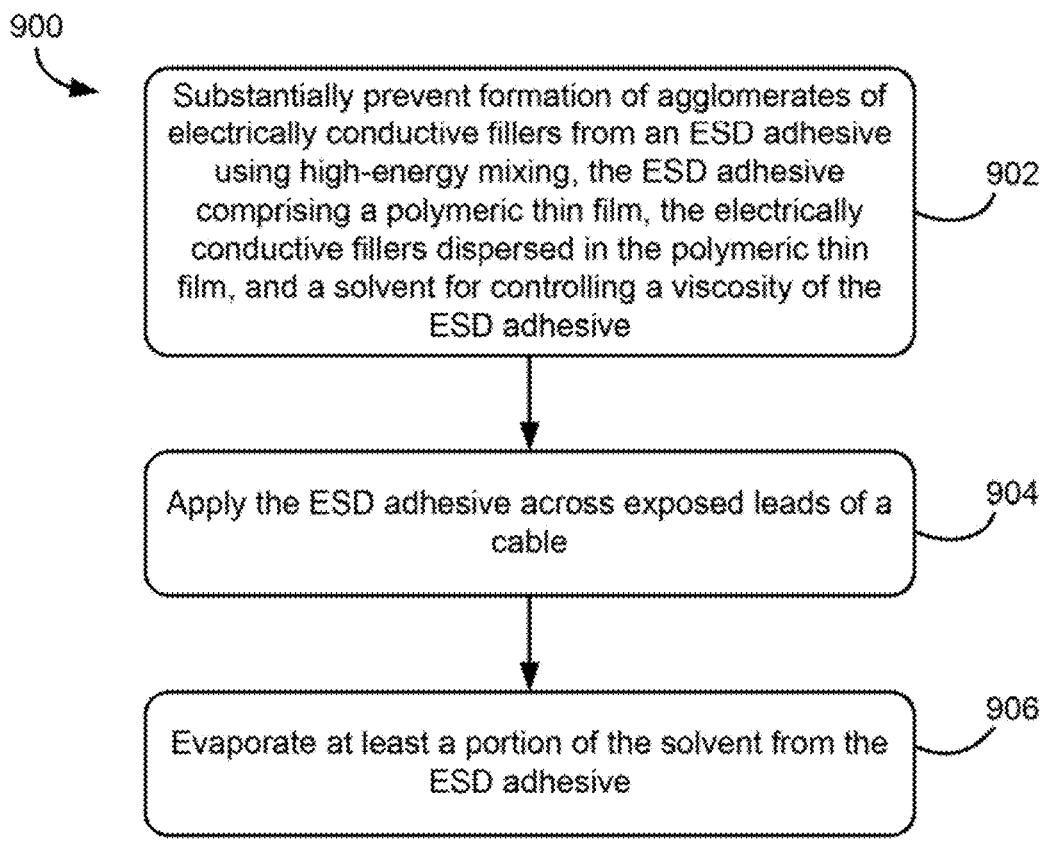
FIG. 9 illustrates a method for providing ESD protection substantially free of agglomerates to an element of an electronic device, according to one embodiment.

Now referring to FIG. 9, a method 900 for providing ESD protection to an element of an electronic device, such as reader and/or writer transducers in a magnetic head, is shown, according to one embodiment. The method 900, in some approaches, may be performed in any desired environment, and may include embodiments and/or approaches described in relation to FIGS. 1-8. Of course, more or less operations than those shown in FIG. 9 may be performed as would be known to one of skill in the art.

In operation 902, agglomerates of electrically conductive fillers are substantially prevented from forming in an ESD adhesive by performing high-energy mixing prior to and/or while forming the ESD adhesive. The ESD adhesive, in one approach, comprises a polymeric thin film, the electrically conductive fillers dispersed in the polymeric thin film, and a solvent for controlling a viscosity of the ESD adhesive.

The solvent, according to various embodiments, may comprise at least one of: xylene, toluene, and THF. The polymeric thin film, according to various embodiments, may comprise at least one of: a polyurethane compound, a polyester compound, a polyacrylate compound, a polymethacrylate compound, and an epoxy compound. The electrically conductive fillers, according to various embodiments, may comprise at least one of: carbon black, carbon nanotubes, silver nanoparticles, gold nanoparticles, and fullerene compounds.

Figure 10:
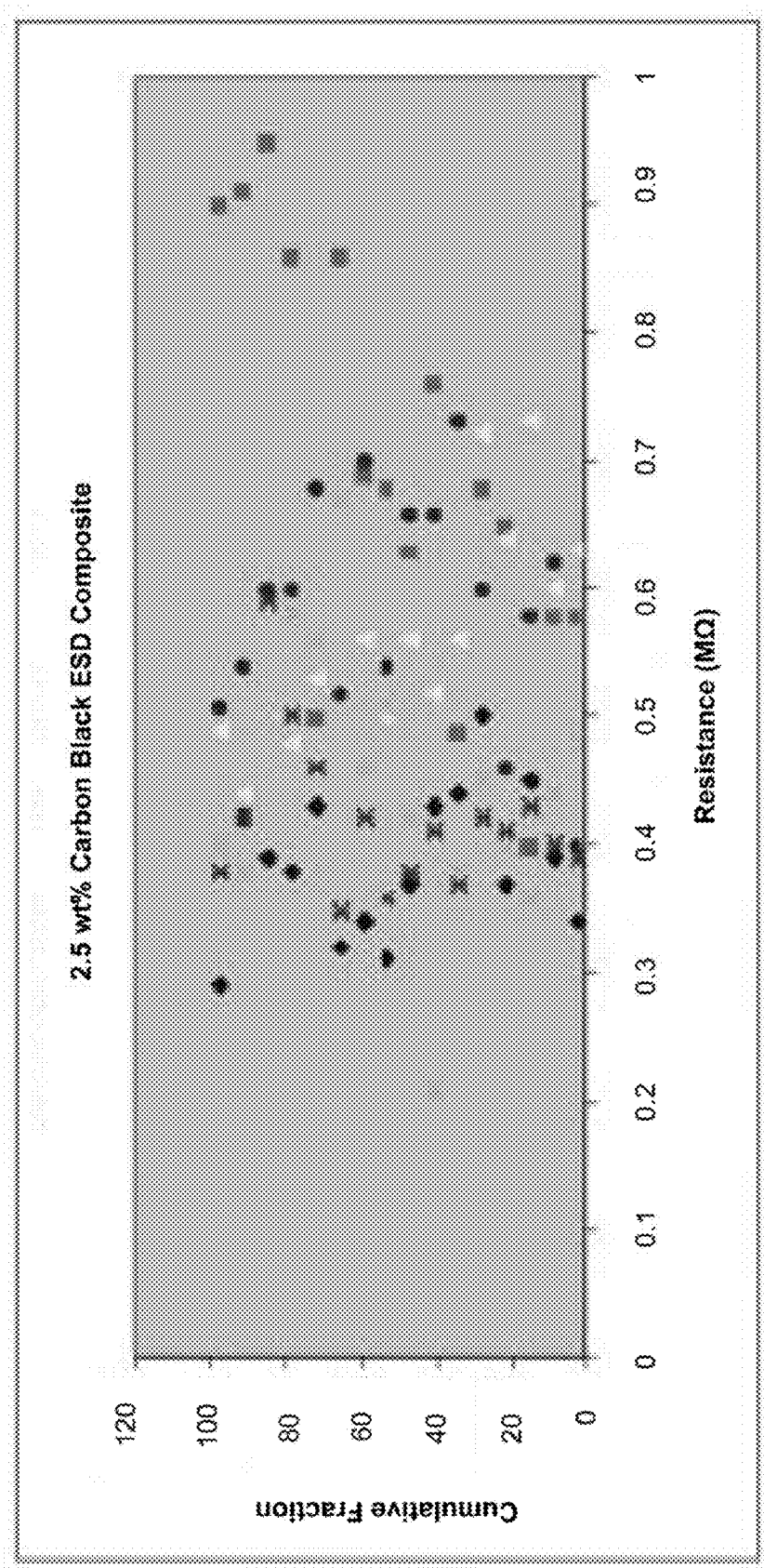
FIG. 10 shows resistance values according to of ESD adhesives produced using a high-energy mixing process, according to one embodiment.

In one approach, in order to reduce agglomerates and particle size, electrically conductive filler particles may be combined with a polymeric thin film in a hid shear speed mixer at 4000 rpm using counter-rotating paddles. For example, when using high-speed shear mixing to prepare a 2.5 wt. % carbon black ESD composite, lead to lead resistances were noticeably higher than the preferred 100 kΩ threshold, as evidenced in FIG. 10. Comparatively, when using the conventional low-energy mixing methods to produce an ESD adhesive with equivalent carbon black concentrations, resistance values were commonly observed well below the 100 kΩ threshold, often resulting from agglomerates, as evidenced by the datapoints in regions 602 and 604 of FIG. 6.

In another approach, ball milling may be carried out using nonconductive milling balls, including, for example, glass or other suitable nonconductive milling materials as would be understood by those having ordinary skill in the art upon reading the present descriptions. Ball milling the conductive particles, such as carbon black in one exemplary embodiment, reduces particle size and substantially prevents the formation of agglomerates in the ESD adhesive. By substantially preventing formation of agglomerates, what is meant is that agglomerates of a certain size range are vastly reduced or completely removed from the mixture. The agglomerates of a certain size range that are vastly reduced or eliminated are those having a diameter that is greater than about 2× the mean particle diameter of the conductive filler particles, the longest mesh opening size, etc. In addition, larger sized agglomerates are completely removed from the mixture, which includes agglomerates having a diameter that is greater than about 3× the mean particle diameter of the conductive filler particles, the longest mesh opening size, etc. In this way, there is virtually no chance that an agglomerate large and/or long enough to bridge the distance between leads is still present in the mixture after high-energy mixing thereof.

Reduced particle size may be achieved by dry milling the electrically conductive filler particles (e.g., ball-milling of the electrically conductive fillers before the electrically conductive fillers are dispersed in the polymeric thin film) and subsequently mixing the milled particles into a polymer resin, in one embodiment. In other embodiments, conductive filler particle size may be reduced by wet milling/mixing of the conductive filler particles (e.g., ball-milling of the electrically conductive fillers after the electrically conductive fillers are dispersed in the polymeric thin film) dispersed in the resin formulation, which reduces the particle size and agglomerates of conductive filler particles while mixing the ESD adhesive.

In some approaches, the primary particle size may be reduced to approximately 40 nm, which substantially prevents formation of agglomerates and allows resulting ESD materials to be used in applications with extremely small feature sizes (e.g., lead-to-lead distance).

In still other approaches, it is possible to further improve ESD properties of the ESD adhesive by size-selective sifting of the electrically conductive filler particles through a mesh screen prior to mixing with the polymeric thin film and/or resin (e.g., before the electrically conductive fillers are dispersed in the polymeric thin film), in one embodiment. Moreover, meshes of differing size may be employed to sift the electrically conductive filler particles in order to achieve a desired particle size range, and a series of size-selective sifting may be performed using progressively smaller mesh size screens. Any screen or mesh of an appropriate size may be employed, as would be understood by those having ordinary skill in the art upon reading the present descriptions.

In still other approaches, high-energy mixing processes have significant impacts on the resulting composite resistance, and generally the longer the formulation is mixed/milled/sifted, the higher the resistance of the resulting ESD adhesive. As a result, mixing time may be understood as a result-effective variable for determining resistance of a final ESD adhesive. Advantageously, users may thus produce a variety of ESD adhesives with different resistance to electrostatic discharge, and therefore capable of a wide range of applications. Indeed, in some embodiments an ESD adhesive may be produced with a desired resistance by performing high-speed mixing for a prescribed time period, and may be employed in addition to and/or in lieu of a conventional resistor in a circuit.

In some embodiments, the ESD adhesive may be characterized as having a sheet resistivity from about 0.8 MΩ/sq to about 3.1 MΩ/sq after application of the ESD adhesive to a structure.

For example, in one approach where high-speed mixing was performed for 15 min at 4000 rpm using a particle homogenizer led to an average resistance of about 0.5 MΩ. Moreover, where mixing time was extended to 30 min, the average resistance was observed to be about 1 MΩ. Of course, different mixing times will produce different resistances, depending on the identity of the polymeric thin resin compound and the electrically conductive particles, as well as the high-energy mixing method, as will be understood by those having ordinary skill in the art upon reading the present descriptions. As one hypothetical example, high-speed shearing may require a different mixing time to achieve similar resistance values in the same type of ESD adhesive.

Referring again with FIG. 9, in operation 904, the ESD adhesive is applied across exposed leads of a cable. The ESD adhesive, according to one embodiment, includes a polymeric thin film, electrically conductive fillers dispersed in the polymeric thin film, and a solvent for controlling a viscosity of the ESD adhesive.

In operation 906, at least a portion of the solvent is evaporated from the ESD adhesive. The solvent enables the ESD adhesive to form around the exposed leads of the cable. In one approach, at least some of the leads may be coupled to an element of an electronic device. After the ESD adhesive has formed around the leads, the solvent may be evaporated out so that the ESD adhesive obtains a structure similar to an elastomer, in one approach.

According to one embodiment, the ESD adhesive may be applied via an application method selected from the group consisting of: syringing, silk screening, painting, and spraying. Of course, any other application method known in the art may be used also.

In one approach, the solvent may be xylene, the polymeric thin film may be a polyurethane, and the electrically conductive fillers may be carbon black. Of course, any other combination of components may be used, as described previously.

In another approach, the ESD adhesive may have a viscosity in a range from about 10 CP to about 2000 CP prior to evaporation of the solvent therefrom, and more preferably in a range from about 30 CP to about 250 CP prior to evaporation of the solvent therefrom, enabling the ESD adhesive to flow around a surface area of the exposed leads of the cable in a coverage area. The coverage area is a portion of the exposed leads where the ESD adhesive is applied. Preferably, the coverage area will be as close to 100% as possible. However, in some other embodiments, and as dictated by the particular application in which the ESD adhesive is being used, the coverage area may be greater than about 95%, greater than about 90%, greater than about 80%, etc.

In another embodiment, the ESD adhesive may have a lead-to-lead resistance in a range from about 50 kΩ to about 10 MΩ, about 10 kΩ to about 100 MΩ, or any other range therebetween or as suited to the particular application for which the ESD adhesive is being used.

According to some embodiments, the ESD adhesive described herein may have one or more of the following benefits, such as better protection of MR sensors from ESD damage; inexpensive materials may be used to prepare the ESD adhesive, resulting in an inexpensive ESD protection solution; the method for applying the ESD adhesive is simpler and uses techniques similar to methods for applying adhesives in other areas of manufacturing; MR sensor protection is immediate once the ESD adhesive is applied, which allows for the ESD adhesive to be applied before the magnetic head is attached to the cable, providing protection through the entire assembly process; no out gassing of volatile materials occurs in the application of the ESD adhesive, providing a safer application environment and reduced ventilation requirements; the materials used in the ESD adhesive cause no physical change to the materials used in the cable or the connector assembly; the ESD adhesive has a long shelf life, in contrast to conventional epoxies and room temperature vulcanizing (RTV) silicones, which are commonly used for attaching the cable to the magnetic head and have a limited shelf life; the low viscosity of the ESD adhesive allows for increased surface contact with read and/or write transducer leads, thereby providing better protection than more viscous materials; if the viscosity of the ESD adhesive changes, it may be returned to an original viscosity with the addition of a common solvent; the low viscosity of the ESD adhesive results in desired resistivities not achievable via other materials; the choice of a polymeric material thinned by a solvent results in superior flow properties while also providing a desired resistivity.

It will be clear that the various features of the foregoing methodologies may be combined in any way, creating a plurality of combinations from the descriptions presented above.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
an electrostatic discharge (ESD) adhesive coupled to a plurality of leads in a coverage area for providing ESD protection to at least one element of an electronic device, the ESD adhesive comprising a mixture of a polymeric thin film and electrically conductive fillers dispersed in the polymeric thin film,
wherein the ESD adhesive has a resistance in a range from about 10 k$\Omega$ to about 100 M$\Omega$,
wherein the coverage area is a portion of the plurality of leads where the adhesive is applied,
wherein the ESD adhesive is a homogenous mixture substantially free of agglomerates of the electrically conductive fillers,
wherein each of the plurality of leads are separated by a lead-to-lea spacing, and wherein the electrically conductive fillers dispersed in the polymeric thin film are characterized as having an average particle size that is less than the lead-to-lead spacing.

2. The system as recited in claim 1, wherein the at least one element of the electronic device is a read transducer of a magnetic head.

3. The system as recited in claim 1, wherein the ESD adhesive further comprises a solvent for controlling viscosity, the solvent comprising at least one of: xylene, toluene, and tetrahydrofuran (THF), wherein the polymeric thin film comprises at least one of: a polyurethane compound, a polyester compound, a polyacrylate compound, a polymethacrylate compound, and an epoxy compound, and wherein the electrically conductive fillers comprise at least one of: carbon black, carbon nanotubes, silver nanoparticles, gold nanoparticles, and fullerene compounds.

4. A system, comprising:
an electrostatic discharge (ESD) adhesive operatively coupled to a plurality of leads of an electronic device for providing ESD protection to at least one element of the electronic device, the ESD adhesive comprising a mixture of a polymeric thin film and electrically conductive fillers dispersed in the polymeric thin film,
wherein the ESD adhesive has a structural characteristic of being formed through at least partial evaporation of a solvent therefrom,
wherein the ESD adhesive has a structural characteristic of being substantially free of agglomerates of the electrically conductive fillers,
wherein each of the plurality of leads are separated by a lead-to-lead spacing, and wherein the electrically conductive fillers dispersed in the polymeric thin film are characterized as having an average particle size that is less than the lead-to-lead spacing.

5. The system as recited in claim 4, wherein the ESD adhesive has a viscosity in a range from about 10 CP to about 2000 CP prior to evaporation of the solvent therefrom, thereby enabling the ESD adhesive to flow around a surface area of the plurality of leads in a coverage area, wherein the coverage area is a portion of the plurality of leads where the ESD adhesive is applied.

6. The system as recited in claim 4, wherein the solvent comprises at least one of: xylene, toluene, and tetrahydrofuran (THF), wherein the polymeric thin film comprises at least one of: a polyurethane compound, a polyester compound, a polyacrylate compound, a polymethacrylate compound, and an epoxy compound, and wherein the electrically conductive fillers comprise at least one of: carbon black, carbon nanotubes, silver nanoparticles, gold nanoparticles, and fullerene compounds.

7. The system as recited in claim 4, wherein the ESD adhesive has a resistance in a range from about 10 k$\Omega$ to about 100 M$\Omega$.

8. The system as recited in claim 4, wherein the ESD adhesive has a structural characteristic of being subjected to high-energy mixing in order to substantially remove agglomerates of the electrically conductive fillers therefrom.

9. The system as recited in claim 4, wherein the ESD adhesive is free of agglomerates of the electrically conductive fillers having a diameter greater than about three times a mean particle diameter of the electrically conductive fillers.

10. An electrostatic discharge (ESD) adhesive, comprising:
a polymeric thin film;
electrically conductive fillers dispersed in the polymeric thin film; and
wherein the ESD adhesive has a structural characteristic of being formed through at least partial evaporation of a solvent therefrom,
wherein the ESD adhesive has a resistance in a range from about 10 k$\Omega$ to about 100 M$\Omega$ after evaporation of the solvent therefrom,
wherein the ESD adhesive has a viscosity in a range from about 30 CP to about 250 CP prior to evaporation of the solvent therefrom, and
wherein the ESD adhesive is substantially free of agglomerates of the electrically conductive fillers having a diameter greater than about three times a mean particle diameter of the electrically conductive fillers.

11. The electrostatic discharge adhesive as recited in claim 10, wherein the ESD adhesive is characterized as having a sheet resistivity from about 0.8 MΩ/sq to about 3.1 MΩ/sq.

12. The electrostatic discharge adhesive as recited in claim 10, wherein the ESD adhesive is characterized as having a concentration of electrically conductive fillers from about 1.0 wt % to about 4.0 wt %.

13. The electrostatic discharge adhesive as recited in claim 10, wherein the ESD adhesive is free of agglomerates of the electrically conductive fillers having a diameter greater than about three times a mean particle diameter of the electrically conductive fillers.

\* \* \* \* \*